Figure 1:
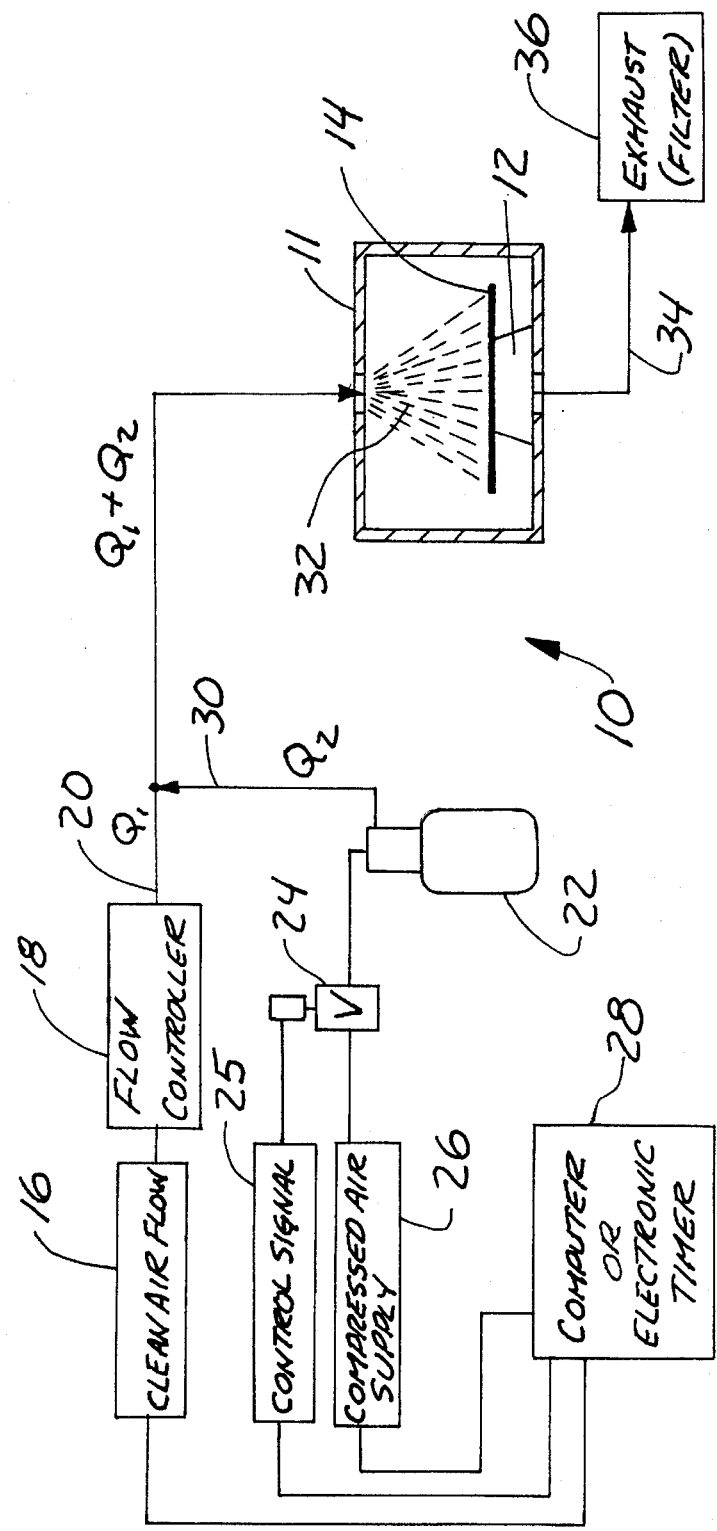

United States Patent [19]

Liu

[11] Patent Number: 5,534,309

[45] Date of Patent: Jul. 9, 1996

[54] METHOD AND APPARATUS FOR DEPOSITING PARTICLES ON SURFACES

[75] Inventor: Benjamin Y. H. Liu, North Oaks, Minn.

[73] Assignee: MSP Corporation, Minneapolis, Minn.

[21] Appl. No.: 263,128

[22] Filed: Jun. 21, 1994

[51] Int. Cl.$^6$ ..................................................... B05D 1/12
[52] U.S. Cl. ......................... 427/458; 427/180; 427/475; 427/486; 427/421; 427/10; 118/688; 356/38; 356/243; 377/10
[58] Field of Search ..................................... 427/180, 458, 427/475, 486, 421, 10; 118/688, 689, 690, 691, 712; 356/38, 243; 377/10

[56] References Cited

U.S. PATENT DOCUMENTS 5,194,297  3/1993  Scheer et al. ............................ 427/180
5,306,345  4/1994  Pellet et al. ............................. 427/282

OTHER PUBLICATIONS

Journal of the IES, vol. 35, No. 6, Nov./Dec. 1992, S. Chae et al., "Size Response Characteristics of a Wafer Surface Scanner for Nonideal, Real–World Particles", pp. 45–52.
Aerosol Science and Technology, vol. 6, Jun. 1987, B. Y. H. Liu et al, "Particle Deposition on Semicondcutor Wafers", pp. 215 to 224.

Aerosol Scient and Technology, "Experimental Study of Particle Deposition on Semiconductor Wafers", 12:795–804, 1990 (month unknown).
J. Colloid Interface Sci, "A submicron Aerosol Standard and the Primary, Absolute Calibration of the Condensation Nuclei Counter", 47:155–171, 1974. [month unknown].

*Primary Examiner*—Shrive Beck
*Assistant Examiner*—Timothy W. Meeks
*Attorney, Agent, or Firm*—Westman, Champlin & Kelly

[57] ABSTRACT

A method of providing particle deposition on a semiconductor wafer or other surface first provides a flow of clean gas into a deposition chamber that purges the chamber prior to introduction of the wafer, and after introduction, continues the flow of clean gas. An aerosol is mixed into the clean gas flow for a desired length of time, so that as the combined flow passes through the deposition chamber particles are deposited on the wafer supported in the chamber. After the deposition has continued for either a desired particle count or a length of time, the flow of aerosol is discontinued, and a clean gas flow sheath is provided over the wafer as it is removed from the chamber. The apparatus carries out this method by providing a source of a clean gas, valves for controlling aerosol introduction into the clean gas, and a support for the wafer in the path of gas introduced into the chamber.

10 Claims, 4 Drawing Sheets

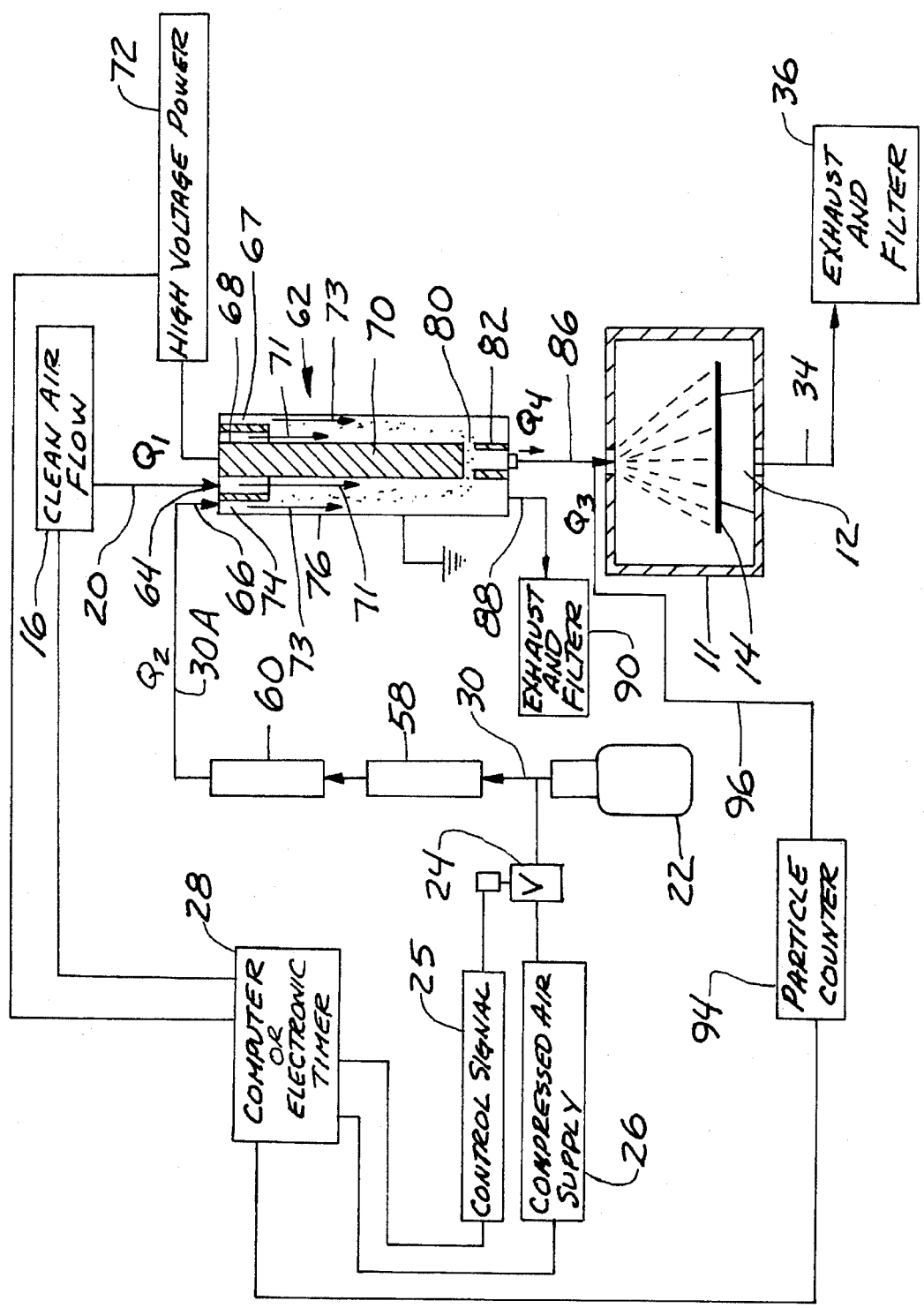

ent invention relates to a method and apparatus for depositing standard or known size particles on a semi-conductor wafer or other surface without mechanical movement of the wafer during the deposition process while precisely controlling the depositing of particles.

METHOD AND APPARATUS FOR DEPOSITING PARTICLES ON SURFACES

BACKGROUND OF THE INVENTION

The present invention relates to a method and apparatus for depositing standard or known size particles on a semiconductor wafer or other surface without mechanical movement of the wafer during the deposition process while precisely controlling the depositing of particles.

In the semiconductor industry, it is often necessary to determine the number of particles on a wafer by use of a wafer inspection tool. Such tools generally operate on the principle of light scattering, which measures the particle size on the wafer by the amount of light scattered by each particle as a laser beam is swept across the wafer surface. To standardize such an inspection tool it is necessary to deposit particles of a known size on a wafer and place the wafer in the inspection tool to determine the response from that reference wafer particles, for comparison with known factory settings of the inspection tool. It is also important to know the number of particles on the wafer, and to have a reasonably uniform distribution of particles on the wafer surface. This will essentially be a calibration process to ensure that the results obtained from the wafer inspection tool are accurate or in some way can be correlated to standard readings.

In addition, the original calibration of the inspection tool in the factory is also based on the use of known size particles on a wafer. The most commonly used calibration particles are polystyrene latex (PSL) spheres, usually in the size range between 0.1 µm and 2 µm. Also, there is a need to deposit uniform size particles of silicon, silicon dioxide, silicon nitride and similar materials on wafers, to determine the response of the inspection tool to particles of a different material. See for example the article by S. A. Chae, H. S. Lee and B. Y. H. Liu "Size Response Characteristics Of A Wafer Surface Scanner for Non-Ideal, Real-World Particles" *Journal of the IES* 35(6):45–52, December 1992.

A commonly used method of depositing such standard calibration particles on a wafer is to make a suspension of the particles, such as PSL, in water, and then atomize the suspension to form a spray. The spray is allowed to dry leaving uniform sized PSL particles suspended in air to form an aerosol. The aerosol is then introduced into a chamber that holds the wafer to permit these particles to deposit on the wafer surface. The mechanism that causes particles to deposit on a wafer from an aerosol are well known. Theoretical and experimental studies have shown that the principle deposition mechanisms are gravitational settling, and diffusion. If the particles are electrically charged, electrostatic attraction also plays a role in particle deposition. See the article by B. Y. H. Liu and K. H. Ahn, entitled "Particle Deposition on Semiconductor Wafers," *Aerosol Sci. Technol.* 6:215–224 1987 and the article by D. Y. H. Pui, et al. "Experimental Study of Particle Deposition on Semiconductor Wafers," *Aerosol Science and Technology* 12:795–804, 1990.

To carry out the deposition in a chamber containing a wafer by the simple introduction of an aerosol into the chamber has a number of disadvantages. First, when the wafer is placed in the chamber, the uncontrolled contaminate particles already in the chamber can deposit on the wafer to cause unwanted contamination of the wafer. Second, when the aerosol is first introduced into the chamber, the particle concentration in the chamber will build up slowly as the aerosol is mixed with the relatively clean chamber air. The rate of particle deposition, therefore, will vary as a function of time due to the varying particle concentration. The varying particle concentration makes it difficult to control the number of particles deposited on the wafer. Similarly, when the aerosol flow into the chamber is stopped, the particle concentration in the chamber will slow decay, again causing variations in particle deposition rate with time and making it difficult to control or know the number of particles deposited.

U.S. Pat. No. 5,194,297 entitled "SYSTEM AND METHOD FOR ACCURATELY DEPOSITING PARTICLES ON A SURFACE" by Bradley H. Scheer, et al. discloses a method of attempting to overcome such difficulty by providing a clean sheath flow area in the chamber. That is, there is a region where there is clean air providing a sheath over the wafer, and a separate aerosol flow area is provided in the same deposition chamber. The wafer is first introduced into the clean sheath flow area prior to deposition, and is protected from deposition of particles when in the clean sheath flow area. The wafer is then moved mechanically into the aerosol flow area for deposition, and then back to the clean sheath flow area following deposition, to complete the cycle. Mechanical movement of the wafer in a deposition chamber is complicated, and can cause unwanted contaminate particles to be generated by the mechanical movement of a conveyor belt, a robot arm or other gear mechanism needed to move the wafer between the two regions within the chamber.

The present invention seeks to overcome the problems inherent in accurately depositing known size particles onto a wafer, without introducing unwanted contaminates, in a simple, easily controlled method.

SUMMARY OF THE INVENTION

The present invention, in its simplest form, provides a chamber in which a wafer can be supported in a known manner, and initially provides a source of particle free gas, such as air or dry nitrogen, to purge the chamber of unwanted particles, making the chamber clean and particle free. After purging, a wafer is placed into the chamber, and an atomizer flow carrying known size particles is combined with the clean air flow on the inlet of the chamber. Thus there is a mixing of the aerosol containing the known size particles and the clean air flow that is introduced into the chamber. The aerosol stream mixed with the clean air flow impinges the wafer surface in the chamber to cause particle deposition. The exhaust air flow from the chamber is usually filtered through a high efficiency filter to prevent the discharge of aerosols into the ambient clean room environment.

After a predetermined time of particle deposition, the atomizer is turned off, utilizing valves that can be manually controlled or through an electronic timer or a computer so that the aerosol flow stops, and the air or gas flow entering the chamber again is restored to its original clean flow. The clean air flow impinges directly on the wafer and thus provides a protective clean air layer to prevent further particle deposition on the wafer surface.

The aerosol flow can be turned on and off quickly, so that the number of particles deposited on the wafer can be accurately controlled. The atomizer forming the particle source can be turned off when particles are not to be deposited, which conserves such materials and the attendant cost.

In a modified form of the invention, the total flow into the chamber is maintained at a known level, even after the aerosol flow has been added to the clean gas flow on the inlet side of the chamber. This makes for a less turbulent air flow in the chamber. Additionally, an electrostatic charge can be applied to the particles, to improve the performance of the particle deposition system.

A very precise control over the particle size can be achieved by adding an electrical aerosol switch which will deflect particles of the desired diameter to the vicinity of a slit opening near the bottom of the switch housing, and then sweeping these particles out of the switch and into the deposition chamber.

The electrical aerosol switch in and of itself is known, but combined with the clean air flow and switching the known size particles into or out of a steady air stream of clean flow provides for a very precise deposition time control.

BRIEF DESCRIPTION OF THE DRAWINGS

FIG. 1 is a schematic representation of a basic particle deposition system made according to the present invention;

FIG. 2 is a modified form of the system of FIG. 1 illustrating a flow control device for input air flow to a deposition chamber;

FIG. 3 is a further modified form of the invention providing electrostatic charge to aerosol particles being deposited on a wafer; and FIG. 4 shows a deposition system made according to the present invention with an electrical particle switch on the input side of the deposition chamber to precisely control the timing of the introduction of particles into a deposition chamber.

DETAILED DESCRIPTION OF THE PREFERRED EMBODIMENTS

Referring to FIG. 1, a basic system for carrying out the present invention is shown. The deposition apparatus illustrated generally at 10 is used in connection with a known deposition chamber 11 which has a support 12 therein for supporting a wafer or object 14 on which particles are to be deposited. The chamber construction is well known and normally will be in a clean room. This depositing arrangement is to provide a known number of particles (within reasonable limits), of a known size and density on a wafer that can be used for calibration purposes or for comparison with wafers in use to determine the particle distribution on such wafers. Various forms of the chamber can be utilized. The deposition apparatus 10 further includes a source of clean air flow indicated generally at 16. It is understood that the source can include other gases, as well as air, such as dry nitrogen. If desired, a flow controller 18 can be put on the outlet line of the clean air flow source 16, to provide a flow of air along a line 20 indicated at $Q_1$. This provides a known flow of clean gas or air, which does not have any contaminating particles.

An atomizer indicated at 22 is used for providing known size particles, such as the PCL particle previously mentioned. The atomizer provides an aerosol, when compressed air is directed into the atomizer 22 through a solenoid valve 24 from a source of clean compressed air 26. The solenoid valve 24 can be controlled by a control signal represented at 25 provided by an electronic timer or a computer 28. The timer or computer 28 also can control provision of the clean air flow from source 16 by operating a suitable valve.

The outlet line 30 from the atomizer 22 is connected to the line 20, downstream from the flow controller 18, but between the flow controller and the deposition chamber 11. An atomizer flow $Q_2$ is provided on line 30. As can be seen, the line 20 has an inlet connection into the interior of the deposition chamber 11. When the valve 24 is energized by providing a control signal 25 from the timer or the computer 28, the atomizer 22 will discharge a known volume of air bearing particles that have been generated in a known manner to ensure an adequate aerosol flow $Q_2$. The flow along the line 20 between the junction with line 30 and the deposition chamber 11 in this form of the invention will have a total flow of $Q_1+Q_2$, and will be carrying particles into the chamber. These particles will be directed as indicated at 32 on the interior chamber down onto the upwardly facing surface of the wafer 14.

Undeposited particles will be exhausted out through line 34 through an exhaust and filter arrangement 36.

In the process of operating the apparatus shown in FIG. 1, air flow from source 16 is first turned on, and again it is a source of particle free gas or air obtained in a known manner. The clean air flow into the deposition chamber 11 is permitted to purge the chamber of unwanted particles, until it is known that the chamber is clean and particle free. These unwanted particles will be discharged out through the exhaust line 34 and the exhaust and filter arrangement 36. Sufficient initial clean air flow is provided for a sufficient length of time to ensure that the unwanted particles in the chamber 11 have been purged.

Then, wafer 14 is placed in the chamber on support 12 (this can be any suitable support and is shown on schematically). The clean air flow can continue during the installation of the wafer to keep the chamber volume free of particles. The solenoid valve 24 is energized after the wafer is installed and the chamber closed, which starts the aerosol flow $Q_2$ of known size and volume of particles. The flow $Q_2$ enters the line 20 and mixes with the clean air flow $Q_1$ to form a combined aerosol stream $Q_1+Q_2$ that is passed into the chamber 11, and is directed toward the upward surface of the wafer 14 on which the particles are to be deposited. The aerosol stream impinges on the wafer in the chamber 11 to cause the particle deposition on the chamber 11. The exhaust air flow is through a filter, which is preferably a high efficiency filter, to prevent the discharge of the aerosol into the ambient clean room environment in which these processes normally take place.

After a predetermined time period of particle deposition the atomizer 22 is turned off by turning off valve 24, either manually or with an electrical signal from a precision timer or computer 28. The aerosol flow $Q_1$ will stop and flow entering the chamber 11 is then again restored to its original clean air or gas flow $Q_1$. Since the clean air flow is impinging directly on the wafer 14, as shown, it provides a protective clean air layer to prevent further particle deposition on the wafer surface from particles that may remain in the chamber 11 at least for a short period of time. When the wafer 14 has been left for a sufficient period of time to ensure that a clean air layer is flowing on the wafer, it can be removed from the deposition chamber 11 for use in an analysis instrument, or for any other use that may be desired. The wafer does not have to be shifted from its original position within the chamber 11, and yet receives a direct impingement of clean sheath air while it is being placed into the chamber. The wafer will be in a purged clean, particle free chamber to prevent contaminants from depositing thereon. After the deposition time, which can be relatively accurately controlled, the wafer 14 can be removed and then will have a known number of particles of a known size on it.

The aerosol flow switching method disclosed has the further advantage of having atomizer 22 turned on only for the short time duration when the aerosol is needed for deposition. During the remaining time the atomizer 22 is left idle, to reduce the amount of liquid suspension that must be atomized to form an aerosol, leading to a savings in both material and cost. The fact that the atomizer 22 is turned on only when needed for deposition of particles on a wafer, also minimizes the unwanted particle build-up on the interior surfaces of the deposition system, making it unnecessary to take the system apart for frequent cleaning.

Figure 2:
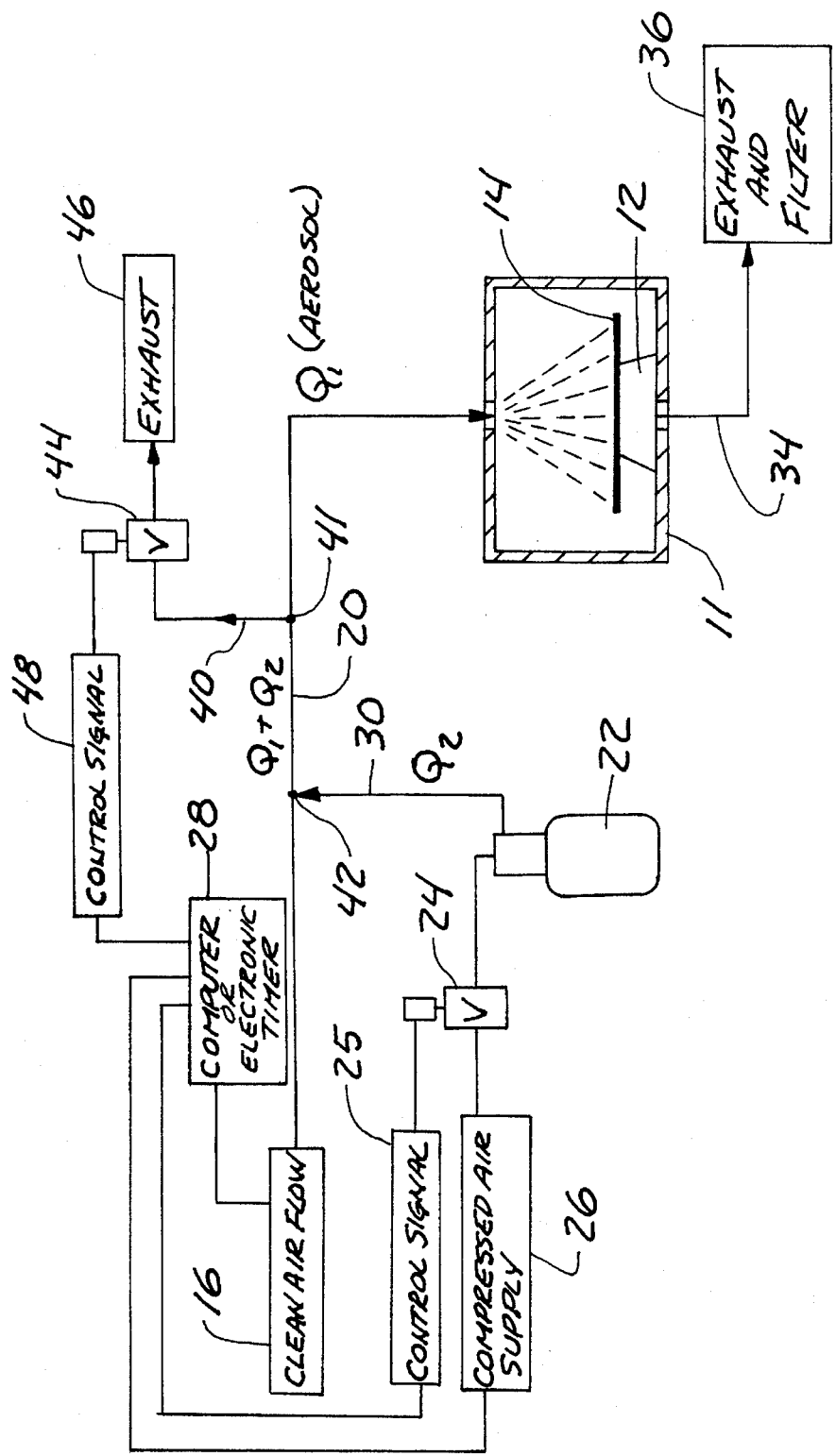

FIG. 2 shows a modified system for obtaining a more precise flow into the deposition chamber 11 by avoiding flow disturbances. The system of FIG. 1 shows the flow into the chamber 11 when the atomizer 22 is turned on, that is, the total flow into the deposition chamber 11 will be $Q_1+Q_2$, and when the clean air flow only is flowing into the chamber 11 the flow is only $Q_1$. FIG. 2 shows a way of avoiding flow disturbances caused by changing flow volumes. In FIG. 2 the same components are numbered the same, and include the aerosol chamber 11, the support 12 on which wafer 14 is mounted. The exhaust line 34 and inlet line 20 are numbered the same.

A bleed line 40 to line 20 is connected to the line 20 at a junction or "T" fitting 41 that is downstream from a connection 42 between the line 30 and the line 20. The line 30 carries the aerosol whenever the solenoid valve 24 is energized, as previously explained.

The line 40 is connected through a second solenoid valve 44 to an exhaust arrangement 46 that also can have a filter if desired. The valve 40 is energized and de-energized or controlled by a control signal 48 from the electronic timer or computer 28 which synchronizes the controls for the control signal 25 operating the solenoid valve 24. After the atomizer 22 is turned on by energizing solenoid valve 24, the aerosol flow is mixed with the clean air flow $Q_1$ at junction 42, as before, and solenoid valve 44 is opened and controlled as to its port size (it can be a flow control valve) diverting part of the mix flow $Q_1+Q_2$ at junction 41. The diverted flow equal to $Q_2$, is exhausted through the exhaust arrangement 46. The combined stream is thus divided, and the portion of the line 20 downstream, and that is in direction toward deposition chamber 11, from junction 41 will continue to have a flow volume $Q_1$, but it will be an aerosol flow. The total flow into the chamber 11 is thus kept constant at $Q_1$ at all times.

The process is the same as before, with the deposition chamber 11 being purged by a clean air or gas flow from source 16 under control of timer or computer 28, and when the deposition chamber 11 has been purged so there are no foreign particles in the chamber, the wafer 14 or other object on which deposition of particles is to take place is moved onto support 12. Then the solenoid valve 24 will be opened to provide aerosol flow $Q_1$ along line 30, and valve 44 will be also open, at an appropriate time, to control the total flow coming through line 20 between junction 41 and the deposition chamber 11 at a volume of $Q_1$ but with aerosols in that volume.

The timing of course can again be carried out as previously explained to stop the atomizer flow at the desired time so that the deposition on the wafer will be as desired.

Figure 3:
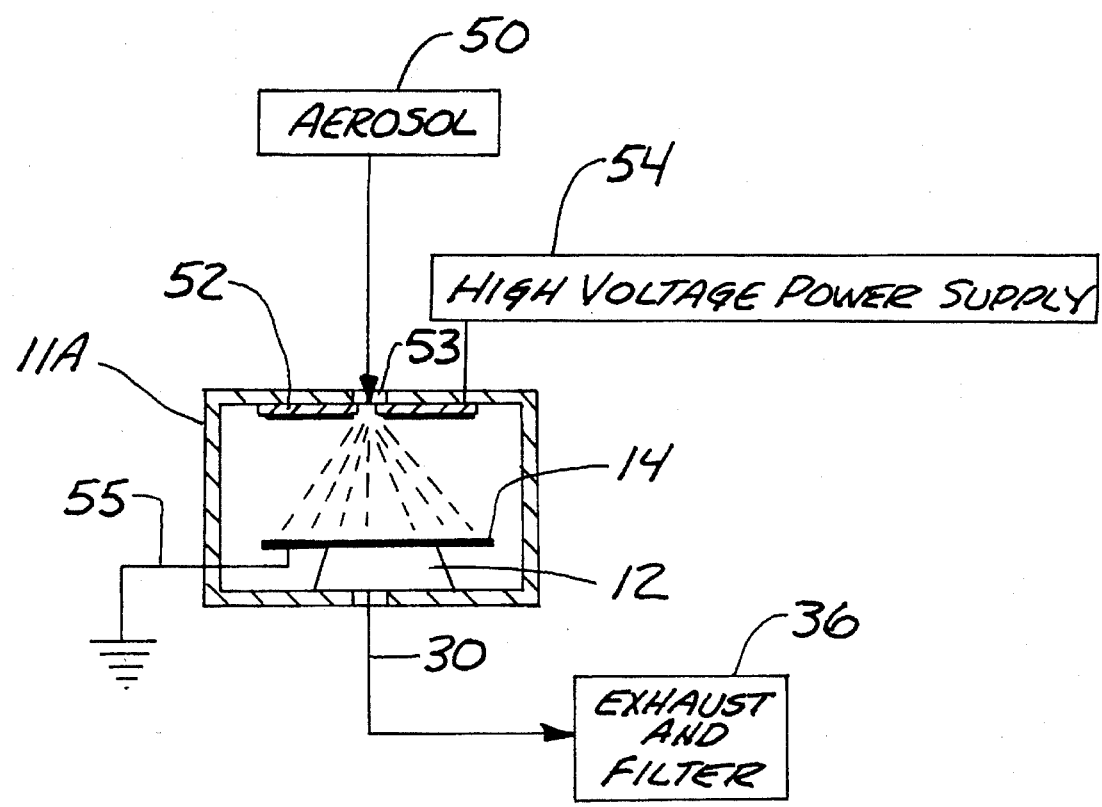

FIG. 3 shows a further modified form of the present invention. In this instance, the aerosol represented at 50 could be the aerosol between the junction 41 and the deposition chamber 11 of FIG. 2. The aerosol would be provided as previously explained after air flow for purging the deposition chamber 11 before the wafer is put into place.

After the atomizer 22 has been turned off the chamber 11A of FIG. 3 can be purged with clean gas.

Single aerosol particles produced by atomization are usually electrically charged. Thus, it is possible to increase the rate of particle deposition by means of an applied electric field. In the deposition chamber 11A of FIG. 3, a metal plate 52 is provided and it surrounds the inlet port 53. The plate 53 is connected to a high voltage power supply 54 to provide an electrical potential on the plate. The metal plate 53 is mounted on an insulating support, and connected so that it is electrically insulated from the deposition chamber 11A. The wafer 14 itself is connected to a ground connection through a line 55, which can connect through the wafer, or to the wafer support 12, as desired.

In this system, when the aerosol stream entering the chamber 11A impinges on the wafer 14 and the particles carried in the flow of the aerosol will have an electrostatic change applied, causing the rate of particle deposition to increase, thereby shortening the time required for particle deposition to achieve a known number of particles or particle density on the wafer 14.

The electrically charged plate 53 can be used with either of the systems shown in FIGS. 1 and 2, to further improve particle deposition by lessening the time needed for providing adequate deposition on a particular wafer 14.

The same procedure for deposition is used prior to the introduction of the aerosol into line 20, and also upon completion of the aerosol deposition, namely the purging of the chamber initially before the wafer 14 is put into place, and providing a clean gas flow over the wafer 14 after the deposition has been stopped.

FIG. 4 shows a further modified form of the present invention, again with like components being numbered the same as in FIGS. 1–3. In this form of the invention, the deposition chamber 11 is provided with an electrical aerosol switch on the inlet side of the chamber. In this instance, the clean air flow is provided from source 16 as previously explained, along the line 20. The clean gas or air flow volume is $Q_1$, as previously explained as well.

The atomizer 22 is connected through a line 30 to a conventional dryer 58. The flow through line 30 is controlled by the valve 24, and control signal 25 from the timer or computer 28 as previously explained as well. Compressed air supply 26 is provided through the valve 24. The dryer 58 is of conventional design which dries the liquid from the aerosol stream, and after passing through the conventional dryer 58, the aerosol, in dry air, is passed through an ionizer 60 which provides an electrical charge to the particles. The ionizer also is a conventional unit used in providing aerosols at the present time. Charged particles are discharged out through line 30A.

The electrical aerosol switch is indicated at 62. It is a cylindrical condenser in which laminar air flow is established. There are two input air streams. Flow $Q_1$ is input into the switch at a connection 64 near the center of the switch, and the flow $Q_2$, which is the input aerosol stream, is provided at an annular input junction 66 adjacent the periphery of the electrical switch 62.

Input air connection 64 for the clean air flow discharges air into an annular chamber or plenum 68, defined by a tubular wall 67 that surrounds a central electrode 70 in a housing 76. The tubular wall 67 also defines an annular chamber 74 inside housing 76, but to the outside of chamber 68. The aerosol input connection 66 lead to the annular chamber 74 that surrounds the chamber 68 so that as the clean air and the aerosol both flow downwardly as indicted by the arrows 71 and 73. The clean air flow is a core of air near the center, adjacent the electrode 70.

The electrode 70 is an inner cylindrical body and is connected to a high voltage power supply. The air flows $Q_1$ and $Q_2$ both flow down through the annular space between the central electrode 70 and the outer housing 76 of the electrical aerosol switch and stay relatively separate. That is, the flows do not substantially intermix. By applying a voltage to the electrode 70, which is an inner cylinder, the particles carried in flow $Q_2$ through the annular chamber 74 continue to move on the outside of the clean air flow, but are deflected across the clean air flow stream coming down around the outside of the electrode 70. The aerosol particles thus are attracted in toward the center electrode, and it is possible, by controlling the electrical field, to deflect particles of the desired diameter in the vicinity of a slit opening shown at 80 down near the bottom of the electrode 70 which is spaced slightly from an outlet tubular cylinder 82.

The cylinder 82 surrounds the outlet opening for air flow from the electrical aerosol switch. The particles attracted toward slit 80 are swept out of the switch by the output aerosol stream indicated at $Q_4$ along the line 86 leading to the deposition chamber 11. Proper size particles are carried with the flow into the deposition chamber 11. Excess aerosols are contained in an exhaust stream $Q_3$ coming from outlet passage 88 of the housing 76 into an exhaust filter arrangement 90.

The electrical aerosol switch 62 described above has been used as an electrostatic particle classifier for producing a monodisperse aerosol from an aerosol that is initially polydisperse. This structure is subject of a descriptive article by the present inventor Benjamin Liu, and D. Y. H. Pui entitled "A SUBMICRON AEROSOL STANDARD AND THE PRIMARY, ABSOLUTE CALIBRATION OF THE CONDENSATION NUCLEI COUNTER" *J. Colloid Interface Sci.* 47:155–171, 1974. However, adapting this type of a classifier to the input side of the deposition chamber 11 gives a great advantage in being able to provide a known size particle and since the flow through the narrow slit 80 of the particles is controlled by the voltage being applied to the electrode 70, the monodisperse aerosol particles can be switched into the deposition chamber 11 and stopped from entering the deposition chamber 11 very rapidly to give a very precise control to the deposition of particles on the wafer 14.

The aerosol produced by the atomizer 22 in this case can be a polydisperse aerosol, and the electrical aerosol switch 62 acts as a classifier to provide a monodisperse aerosol into the particle deposition chamber 11.

Laminar flow is achieved in the cylindrical housing for the electrical aerosol switch 62, and it is used in its traditional role as a particle classifier. However, the additional use as an aerosol switch because of the narrow slit opening that permits a particle to enter only when the electrode is energized, makes it possible to maintain a steady air flow $Q_4$ into the deposition chamber 11 while quickly switching the particles into or out of the stream for precise deposition time control. In other words, there will always be an air flow through the gap 80 into the deposition chamber 11 when the system is operating, but particles will only be entering that gap when the electrode 70 is on.

In FIG. 4 a particle counter 94 can be provided through a line 96 as an option which can be incorporated into the system when desired to count the particles coming in the line 86 and thus into the deposition chamber 11.

The electrical switch 62 also can be used strictly as a particle classifier by controlling the stream of the aerosols through operation of the valve 24 as previously explained while maintaining a steady high voltage on the electrode 70, so that laminar flow in the cylindrical housing 76 will still be maintained, but the timing of particle introduction would then be controlled by the valve 24 operating atomizer 22 inasmuch as the electrode 70 would then be continuously energized.

The output of the airborne particle counter can be used as a signal for the automatic adjustment of the deposition time through the timer or computer 28 as desired.

Automatic adjustment of the deposition time can be determined by the particle count of particles entering the deposition chamber 11, for deposition onto the wafer 14. An electronic controller also can be used and controlled by the particle counter output.

The optional airborne particle counter 94 also can be used with the system shown in FIGS. 1 and 2 to provide automatic particle deposition control.

The system thus provides for the advantages of having a clean air flow that purges the chamber to eliminate unwanted particles from the chamber prior to the time the wafer is introduced, and then controlling the particles being introduced into the chamber to a selected range of sizes for a precise time to deposit the necessary number of particles on the wafer surface. The particles can be shut off in response to a timer, or after a desired particle count as shown as well.

The use of a sheath of clean air after the particles have been deposited on the wafer 14 also ensures that unwanted particles may not be deposited on the wafer as it is being removed from the deposition chamber.

Although the present invention has been described with reference to preferred embodiments, workers skilled in the art will recognize that changes may be made in form and detail without departing from the spirit and scope of the invention.

What is claimed is:

1. A method of depositing particles from a source onto a wafer supported in place at a known location in a deposition chamber comprising the steps of:

providing and maintaining a clean gas flow into the deposition chamber directed onto the wafer supported in place at the known location to purge unwanted particles from the deposition chamber;

providing a gas flow containing particles from the source into the deposition chamber onto the wafer supported in place at the known location for a time to deposit a desired number of particles from the source onto the wafer and then discontinuing the gas flow containing particles from the source; and maintaining the wafer at the known location and providing for a selected time a clean gas flow into the chamber after discontinuing gas flow containing particles from the source prior to moving the wafer from the known location in the deposition chamber.

2. The method of claim 1 including the step of counting the particles from the source being introduced into the deposition chamber for controlling particle introduction.

3. The method of claim 1, wherein the particles from the source carry an electrostatic charge, and an electric field is used to deposit the charged particles in the deposition chamber.

4. The method of claim 1 including a step of controlling a total gas flow into the deposition chamber at a substantially constant volume during the steps of the method.

5. A method of depositing particles from a source onto a wafer in a deposition chamber comprising the steps of:

providing a clean gas flow into the deposition chamber directed onto the wafer to purge unwanted particles from the deposition chamber;

providing an aerosol gas flow containing particles from the source and adding the aerosol flow to the clean gas flow into the deposition chamber to provide a total gas flow containing particles into the deposition chamber and onto the wafer for a time sufficient to deposit a desired number of particles from the source onto the wafer, and then discontinuing the aerosol gas flow containing particles from the source; and maintaining for a selected time a clean gas flow into the chamber after discontinuing the aerosol gas flow containing particles from the source prior to removal of the wafer from the deposition chamber.

6. The method of claim 5 including a step of controlling the total gas flow into the chamber after adding the aerosol flow to maintain a volume of gas flow into the deposition chamber substantially the same as a volume of gas flow into the chamber prior to adding the aerosol flow.

7. The method of claim 6 wherein the step of controlling the total flow comprises bleeding off gas from a line carrying gas flow to the deposition chamber after the step of adding the aerosol flow.

8. The method of claim 1 including a step of providing a particle classifier receiving the gas flow containing particles from the source and classifying the particles from the source prior to introduction into the deposition chamber.

9. The method of claim 8 wherein said classifying step comprises utilizing an electrostatic classifier having a laminar flow of two gases, one comprising the clean gas flow, and the other comprising the flow containing particles, and providing an electrostatic charge on the particles to move the particles from the flow containing particles through the clean gas flow and into the deposition chamber.

10. A method of depositing particles from a source onto a wafer in a deposition chamber comprising the steps of:

providing a clean gas flow into the deposition chamber to purge unwanted particles from the deposition chamber;

introducing a wafer into the chamber while maintaining the clean gas flow and supporting the wafer in place at a known location in the deposition chamber;

providing a gas flow containing particles from the source into the deposition chamber after introduction of the wafer for a time sufficient to deposit a desired number of particles from the source onto the wafer supported in place at the known location and then discontinuing the gas flow containing particles from the source; and maintaining a clean gas flow into the chamber after discontinuing gas flow containing particles from the source for a selected time prior to moving the wafer from the known location and prior to removal of the wafer from the deposition chamber.

\* \* \* \* \*